United States Patent
Rishworth et al.

(10) Patent No.: US 10,431,911 B2
(45) Date of Patent: Oct. 1, 2019

(54) BOARD-TO-BOARD CONNECTING SYSTEM

(71) Applicant: Molex, LLC, Lisle, IL (US)

(72) Inventors: Paul L. Rishworth, Naperville, IL (US); Hoon Chan Goh, Singapore (SG); Chong Thiam Cho, Singapore (SG)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 15/889,408

(22) Filed: Feb. 6, 2018

(65) Prior Publication Data

US 2018/0248285 A1    Aug. 30, 2018

(30) Foreign Application Priority Data

Feb. 7, 2017    (TW) .............................. 106103882 A

(51) Int. Cl.
| | |
|---|---|
| *H05K 1/00* | (2006.01) |
| *H01R 12/70* | (2011.01) |
| *H01R 13/506* | (2006.01) |
| *H01R 12/71* | (2011.01) |
| *H01R 12/73* | (2011.01) |
| *H01R 12/79* | (2011.01) |

(Continued)

(52) U.S. Cl.
CPC ..... *H01R 12/7023* (2013.01); *H01R 12/7082* (2013.01); *H01R 12/716* (2013.01); *H01R 12/73* (2013.01); *H01R 12/79* (2013.01); *H01R 13/506* (2013.01); *H05K 1/144* (2013.01); *H05K 1/147* (2013.01); *H05K 1/189* (2013.01); *H05K 2201/042* (2013.01); *H05K 2201/10189* (2013.01)

(58) Field of Classification Search
CPC . H01R 12/7023; H01R 12/716; H01R 13/506
USPC ...................... 439/65, 74, 67, 492, 493, 499
See application file for complete search history.

(56) References Cited

U.S. PATENT DOCUMENTS

| | | | | |
|---|---|---|---|---|
| 4,389,080 A | * | 6/1983 | Clark .................. | H05K 7/1053 439/607.01 |
| 4,842,531 A | * | 6/1989 | Takemura ............. | G06F 1/1616 16/223 |

(Continued)

FOREIGN PATENT DOCUMENTS

TW    I402006 B    7/2013

*Primary Examiner* — Abdullah A Riyami
*Assistant Examiner* — Nelson R. Burgos-Guntin
(74) *Attorney, Agent, or Firm* — Molex, LLC

(57) ABSTRACT

An electrical connection device and a board-to-board electrical connection assembly, the board-to-board electrical connection assembly comprises an electrical connection device, a first circuit board and a second circuit board. The electrical connection device comprises a support frame and an adapter circuit board, the support frame has a top portion and a bottom portion. The adapter circuit board comprises an upper end portion retained to the top portion of the support frame, a lower end portion retained to the bottom portion of the support frame and a side portion positioned between the upper end portion and the lower end portion, the upper end portion comprises a first connector, the lower end portion comprises a second connector. The first circuit board is provided with a first mating connector for mating with the first connector. The second circuit board is provided with a second mating connector for mating with the second connector.

31 Claims, 12 Drawing Sheets

(51) Int. Cl.
*H05K 1/14* (2006.01)
*H05K 1/18* (2006.01)

(56) References Cited

U.S. PATENT DOCUMENTS

| | | | | |
|---|---|---|---|---|
| 5,227,957 | A * | 7/1993 | Deters | G06F 1/181 312/223.2 |
| 6,336,816 | B1 * | 1/2002 | Yatskov | H01R 12/7005 439/493 |
| 6,379,176 | B1 * | 4/2002 | Ohsawa | H01R 13/193 439/260 |
| 6,449,164 | B1 * | 9/2002 | Gershfeld | H05K 5/0039 174/50 |
| 6,520,789 | B2 | 2/2003 | Daugherty, Jr. et al. | |
| 6,561,821 | B1 * | 5/2003 | Yu | H01R 9/096 439/591 |
| 7,014,475 | B1 | 3/2006 | Mongold | |
| 7,257,886 | B2 * | 8/2007 | Haager | H05K 7/1461 29/739 |
| 7,331,717 | B2 * | 2/2008 | Kiani | G02B 6/3897 385/53 |
| 7,338,291 | B2 * | 3/2008 | Takada | H01R 13/6315 439/65 |
| 7,704,079 | B2 * | 4/2010 | Weiss | H01R 9/2658 439/607.4 |
| 7,985,079 | B1 * | 7/2011 | Wilson | H01R 12/52 439/74 |
| 8,277,261 | B2 * | 10/2012 | Matsuzawa | H01R 13/514 439/607.05 |
| 8,721,350 | B2 * | 5/2014 | Liu | H01R 13/6315 439/65 |
| 8,734,167 | B2 * | 5/2014 | Aimoto | H01R 13/187 439/74 |
| 2001/0000763 | A1 * | 5/2001 | Muramatsu | H05K 3/365 439/74 |
| 2002/0016103 | A1 * | 2/2002 | Behnke | H01R 43/22 439/493 |
| 2003/0224628 | A1 * | 12/2003 | Korsunsky | H01R 31/06 439/65 |
| 2005/0070136 | A1 * | 3/2005 | Korsunsky | H05K 1/14 439/74 |
| 2008/0043449 | A1 * | 2/2008 | Pyle | H05K 7/20145 361/752 |
| 2012/0178273 | A1 * | 7/2012 | Cipolla | H01R 13/514 439/65 |
| 2012/0295453 | A1 * | 11/2012 | Cipolla | H01R 12/716 439/67 |
| 2015/0132976 | A1 * | 5/2015 | Sato | H01R 4/028 439/74 |
| 2018/0248285 | A1 * | 8/2018 | Rishworth | H01R 12/7023 |

* cited by examiner

BOARD-TO-BOARD CONNECTING SYSTEM

RELATED APPLICATIONS

This application claims priority to Taiwanese Application No. 106103882, filed Feb. 7, 2017, which is incorporated herein by reference in its entirety.

TECHNICAL FIELD

The present disclosure relates to an electrical connection device, and particularly to an electrical connection device and a board-to-board electrical connection assembly for the board-to-board electrical connector.

BACKGROUND ART

A connecting system disclosed in U.S. Pat. No. 6,520,789B2 is a technology with connecting two circuit boards by using a flexible circuit board, the way disclosed in this patent in which two end portions of the flexible circuit board are respectively fixed to the circuit boards is that end portions of the flexible circuit board and the circuit board are clamped between inboard clamp members and outboard clamp members, therefore electrical connection of the flexible circuit board with the circuit boards are maintained, however, the way to make the electrical connection between the circuit boards with clamping by using structural clamp members is not only prone to poor contact, but also less suitable for high-speed multi-signal transmission.

U.S. Pat. No. 7,014,475B1 discloses another connecting technology between a flexible circuit board and circuit boards, in which two ends of the flexible circuit board are is respectively soldered to a circuit board, thereby providing another circuit board which can be inserted between the two ends of the flexible circuit board to form the electrical connection.

SUMMARY

Therefore, an object of the present disclosure is to provide an electrical connection device and a board-to-board electrical connection assembly which are more stable and reliable in structure and electrical connection and suitable for high-speed multi-signal transmission.

Another object of the present disclosure is to provide an electrical connection device and a board-to-board electrical connection assembly with convenient assembling, easy manufacturing and cost saving.

Therefore, an electrical connection device of the present disclosure comprises: a support frame having a top portion and a bottom portion; and an adapter circuit board comprising an upper end portion retained to the top portion of the support frame, a lower end portion retained to the bottom portion of the support frame and a side portion positioned between the upper end portion and the lower end portion, the upper end portion comprises a first connector, the lower end portion comprises a second connector.

In some embodiments, the support frame comprises two engaged frame bodies, and the frame bodies are engaged with each other to define an upper retaining mechanism and a lower retaining mechanism, the upper retaining mechanism is provided to retain the upper end portion of the adapter circuit board; the lower retaining mechanism is provided to retain the lower end portion of the adapter circuit board.

In some embodiments, the support frame comprises two engaged frame bodies, the two frame bodies have the same structure, each frame body comprises an outer frame portion and two side walls, a top frame portion and a bottom frame portion which connect the outer frame portion, when the frame bodies are engaged with each other, the top frame portions of the frame bodies are engaged with each other to define the top portion of the support frame, the bottom frame portions of the frame bodies are engaged with each other to define the bottom portion of the support frame, and the frame bodies are engaged with each other to define an upper retaining mechanism positioned on the top portion of the support frame and a lower retaining mechanism positioned on the bottom portion of the support frame, the upper retaining mechanism is provided to retain the upper end portion of the adapter circuit board, the lower retaining mechanism is provided to retain the lower end portion of the adapter circuit board.

In some embodiments, one of the upper retaining mechanism and the first connector comprises retaining convex rails, and the other of the upper retaining mechanism and the first connector comprises retaining concave rails in which the retaining convex rails are inserted, the first connector is retained to the upper retaining mechanism by that the retaining convex rails are inserted in the retaining concave rails; one of the lower retaining mechanism and the second connector comprises retaining convex rails, the other of the lower retaining mechanism and the second connector comprises retaining concave rails in which the retaining convex rails are inserted, the second connector is retained to the lower retaining mechanism embedded by that the retaining convex rails are inserted in the retaining concave rails.

In some embodiments, the top frame portion and the bottom frame portion are respectively formed with recessed notches, when the frame bodies are engaged with each other, the notches of the top frame portions define an upper opening for exposing the first connector, the notches of the bottom frame portions define a lower opening for exposing the second connector, the retaining convex rails of the upper retaining mechanism are provided in pairs to two opposite inner side edges of the notches of the top frame portions, the retaining convex rails of the lower retaining mechanism are provided in pairs to two opposite inner side edges of the notches of the bottom frame portions, the retaining concave rails are respectively provided in pairs to two opposite sides of each of the first connector and the second connector. In some embodiments, the upper retaining configuration further comprises stopping blocks provided to the retaining convex rails, the first connector abuts against the stopping blocks; the lower retaining mechanism further comprises stopping blocks provided to the retaining convex rails, the second connector abuts against the stopping blocks.

In some embodiments, the upper retaining mechanism further comprises upper support blocks respectively provided to the frame bodies for supporting a back portion of the first connector, the lower retaining mechanism further comprises lower support blocks respectively provided to the frame bodies for supporting a back portion of the second connector.

In some embodiments, the upper retaining mechanism further comprises at least one position-limiting block formed to each of the frame bodies, when the upper end portion of the adapter circuit board is retained to the top portion of the support frame, the upper end portion of the adapter circuit board is interposed between the position-limiting blocks and the upper support blocks.

In some embodiments, the upper end portion of the adapter circuit board further comprises an upper reinforcement plate for supporting the first connector, the lower end portion of the adapter circuit board further comprises a lower reinforcement plate for supporting the second connector, the upper reinforcement plate and the first connector are respectively provided to two opposite surfaces of the upper end portion of the adapter circuit board, the lower reinforcement plate and the second connector are respectively provided to two opposite surfaces of the lower end portion of the adapter circuit board.

In some embodiments, the support frame further comprises latch structures which are respectively provided to the frame bodies and can make the frame bodies be latched to each other, the latch structures comprise latching members respectively provided to one of the frame bodies and complementary latching members which are provided to the other of the frame bodies and can be latched with the latching members.

In some embodiments, each frame body has a plurality of hollow openings.

In some embodiments, the adapter circuit board is a flexible circuit board, each side wall is formed with an upper half penetrating groove close to the top frame portion and a lower half penetrating groove close to the bottom frame portion, when the frame bodies are engaged with each other, the upper half penetrating grooves of the frame bodies are communicated with each other to form a penetrating groove, the lower half penetrating grooves of the frame bodies are communicated with each other to form a penetrating groove, two ends of the adapter circuit board respectively pass through the two penetrating grooves.

In some embodiments, each frame body further comprises position-limiting pieces respectively extending outwardly from the two side walls and having a L-shaped cross section, when the frame bodies are engaged with each other, distal ends of the position-limiting pieces are face each other and the side portion of the adapter circuit board is limited between the position-limiting pieces.

A board-to-board electrical connection assembly of the present disclosure comprises: the aforementioned electrical connection device, a first circuit board provided with a first mating connector for mating with the first connector; and a second circuit board provided with a second mating connector for mating with the second connector.

In some embodiments, each frame body further comprises a positioning post protruding downwardly from the bottom frame portion, and the second circuit board is provided with two positioning holes, when the second connector of the electrical connection device is mated with the second mating connector of the second circuit board, the positioning posts of the frame bodies are respectively inserted into the positioning holes.

In some embodiments, the board-to-board electrical connection assembly further comprises two support post bodies provided between the first circuit board and the second circuit board.

In some embodiments, the first connector is the same as the first mating connector in structure, and the second connector is the same as the second mating connector in structure.

In some embodiments, the first connector and the first mating connector are Mezzanine electrical connectors, the second connector and the second mating connector are Mezzanine electrical connectors.

In some embodiments, the board-to-board electrical connection assembly further comprises a locking element for locking the top portion of the support frame, the upper end portion of the adapter circuit board and the first circuit board, the top portion of the support frame, the upper end portion of the adapter circuit board and the first circuit board are respectively provided with locking holes for the locking element to pass through and be locked.

By that the upper end portion and the lower end portion of the adapter circuit board are respectively fixed to the top portion and the bottom portion of the support frame and then the first, second mating connectors of the circuit board are mated with the first, second connectors, the electrical connection device and the board-to-board electrical connection assembly of the present disclosure can maintain a better electrical contact, and the support frame provides a better support structure for the adapter circuit board, therefore, both the structure and the electrical connection are more stable and reliable. The support frame adopts a way that the two frame bodies are engaged, in addition to convenience of assembling, ease of manufacturing and cost saving, the height adjustment of the support frame can also be achieved by adjusting a height of the frame body to be manufactured. Furthermore, since the side portion of the adapter circuit board can also be used to provide the electronic elements, in addition to facilitating signal processing for adapting during high-speed transmission, also reducing the number of the electronic elements arranged on the circuit boards. And the hollow frame-like structure of the support frame 31 itself is beneficial for heat dissipation via air flow.

BRIEF DESCRIPTION OF THE DRAWINGS

The other features and effects of the present disclosure will be apparent in the detailed description in combination with the accompanying figures, and in which.

DETAILED DESCRIPTION OF THE PREFERRED EMBODIMENTS

Figure 1:
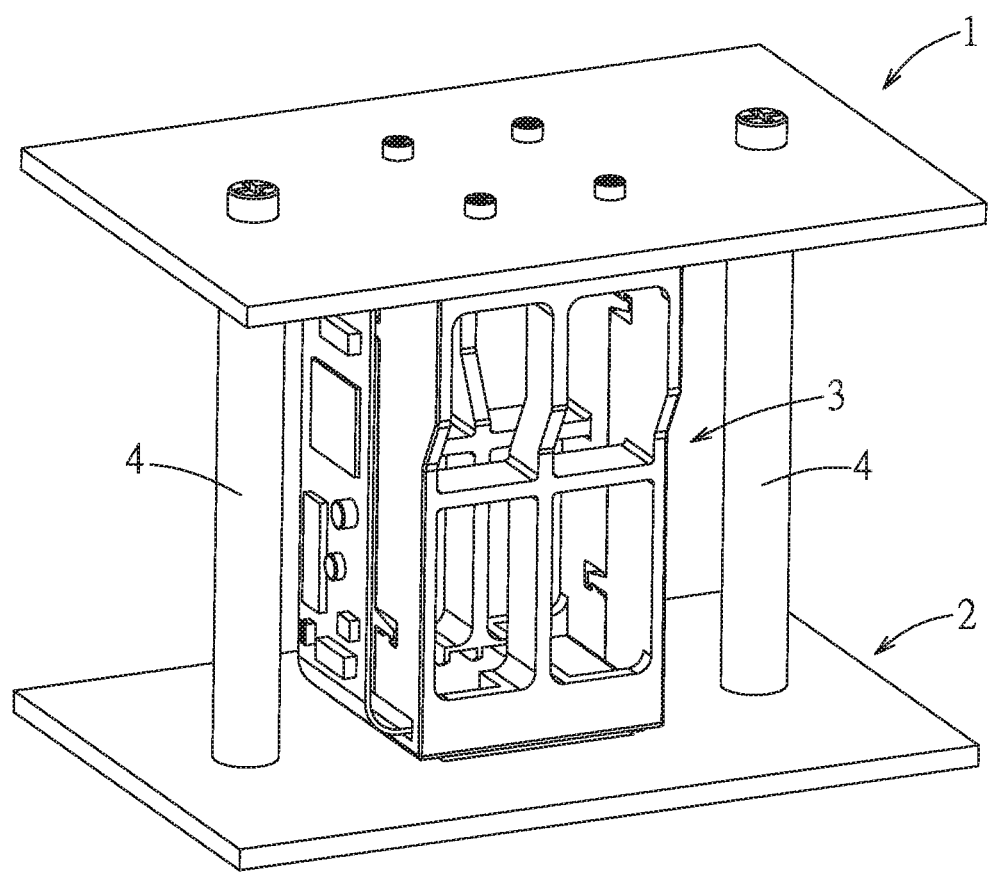
FIG. 1 is a perspective view of a first embodiment of a board-to-board electrical connection assembly of the present disclosure.

Before the present disclosure is described in detail, it should be noted that similar elements are indicated as the same reference numeral in the following description.

Referring to FIG. 1 to FIG. 5, a first embodiment of a board-to-board electrical connection assembly of the present disclosure comprises a first circuit board 1, a second circuit board 2 and an electrical connection device 3, the first circuit board 1 and the second circuit board 2 are spaced apart from each other in an up-down direction and substantially parallel to each other, a surface of the first circuit board 1 facing the second circuit board 2 is provided with a first mating connector 11, a surface of the second circuit board 2 facing the first circuit board 1 is provided with a second mating connector 21, the electrical connection device 3 is used to be provided between the first circuit board 1 and the second circuit board 2 and be connected with the first mating connector 11 of the first circuit board 1 and the second mating connector 21 of the second circuit board 2 so that the first circuit board 1 is electrically connected to the second circuit board 2 via the electrical connection device 3. Furthermore, in order to maintain the stability of the entire structure, the board-to-board electrical connection assembly may further comprise at least two support post bodies 4 locked and mounted between the first circuit board 1 and the second circuit board 2.

Figure 3:
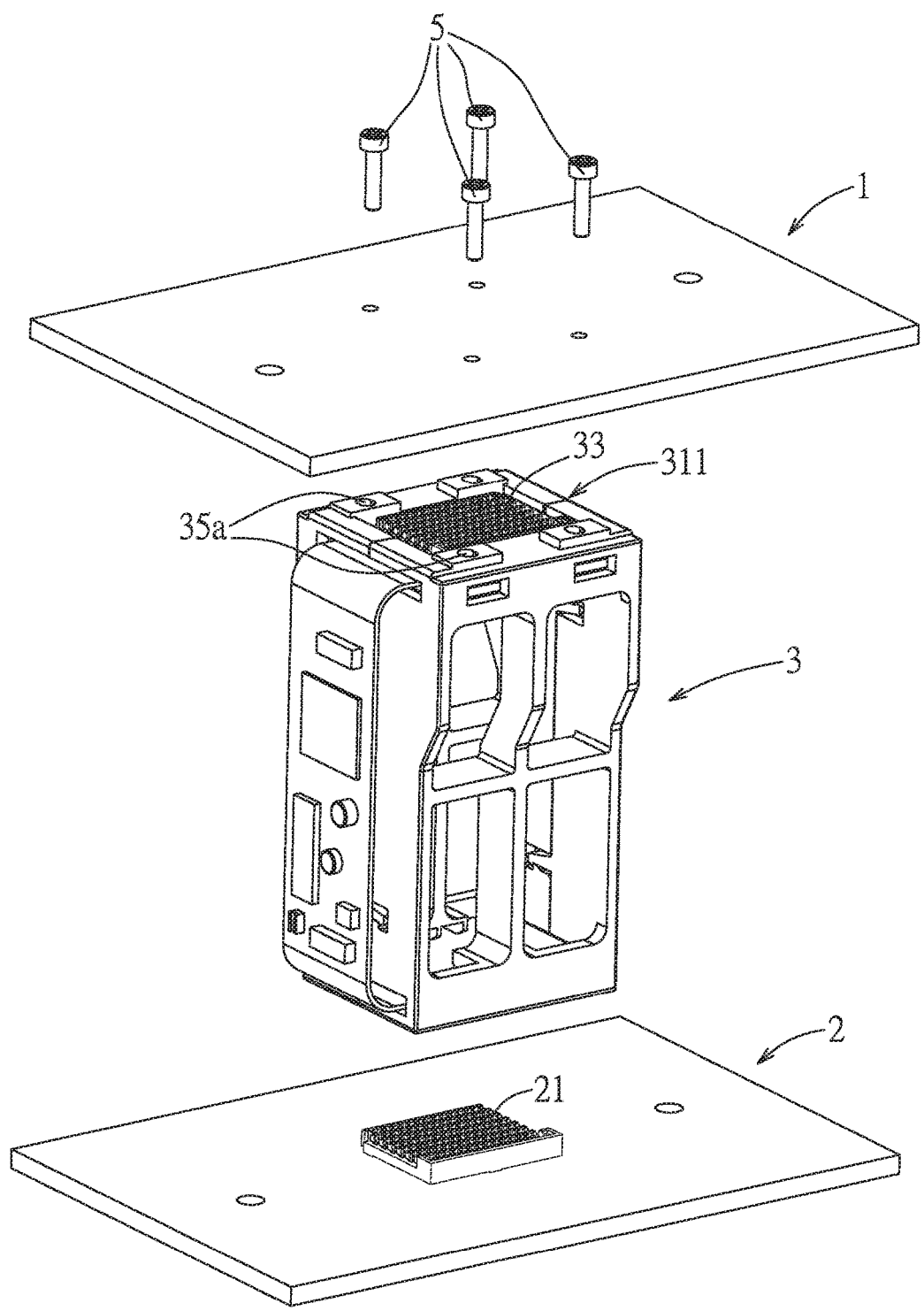
FIG. 3 is an exploded view of some components the first embodiment of the board-to-board electrical connection assembly in which a first circuit board is separated from a second circuit board.
Figure 4:
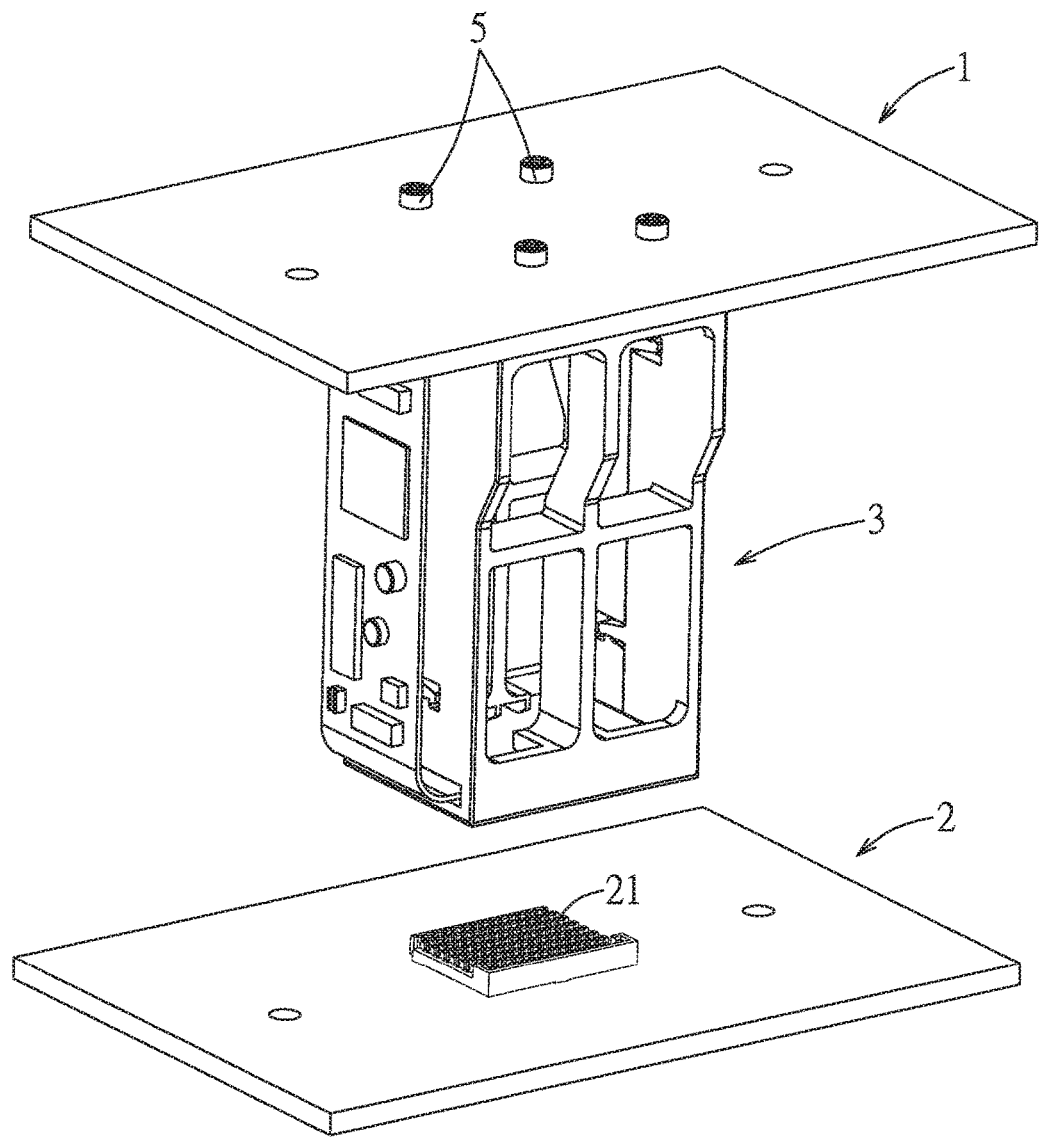
FIG. 4 is an exploded view of some components the first embodiment of the board-to-board electrical connection assembly in which the second circuit board is separated.
Figure 5:
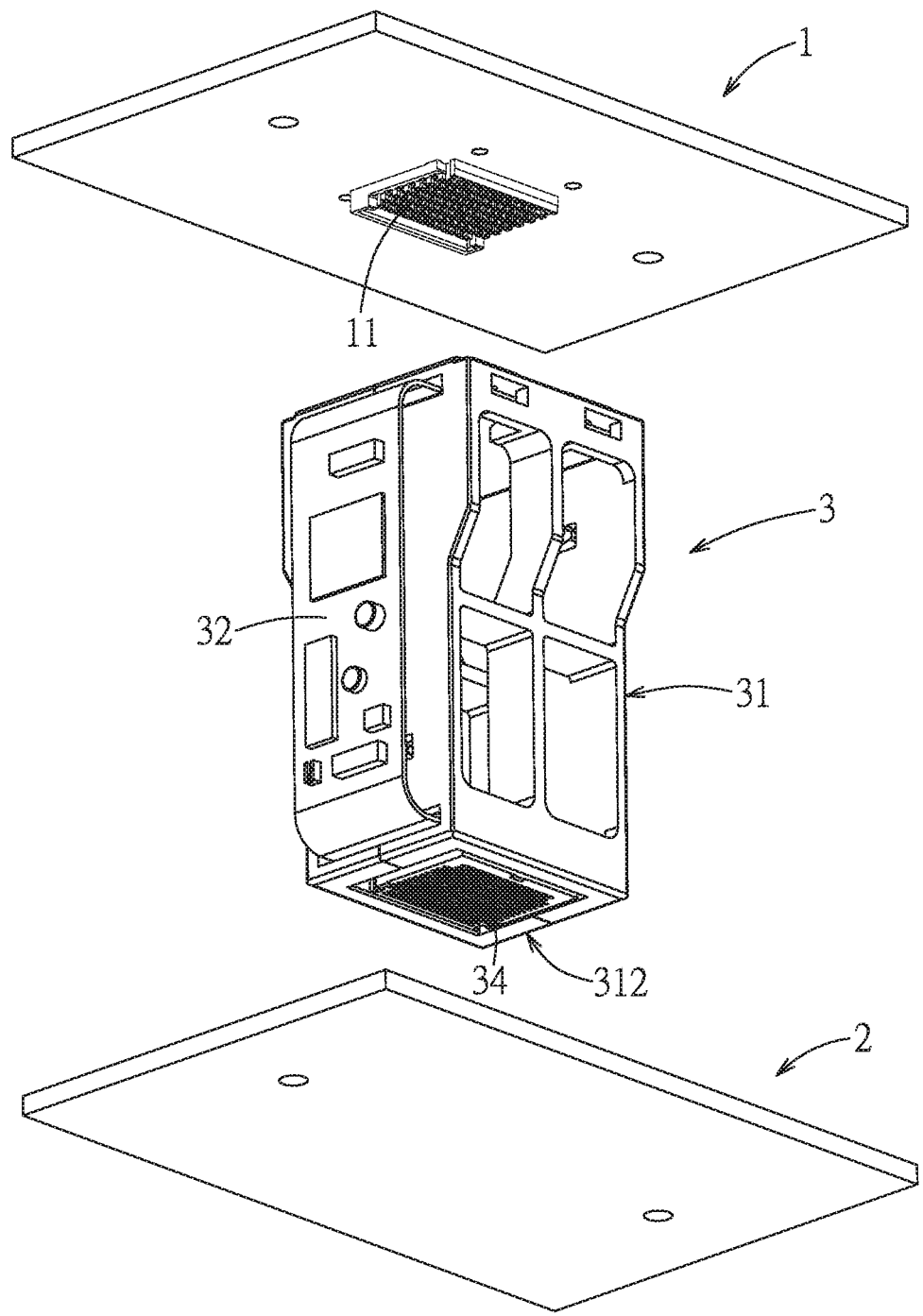
FIG. 5 is a view of FIG. 3 from another angle.
Figure 6:
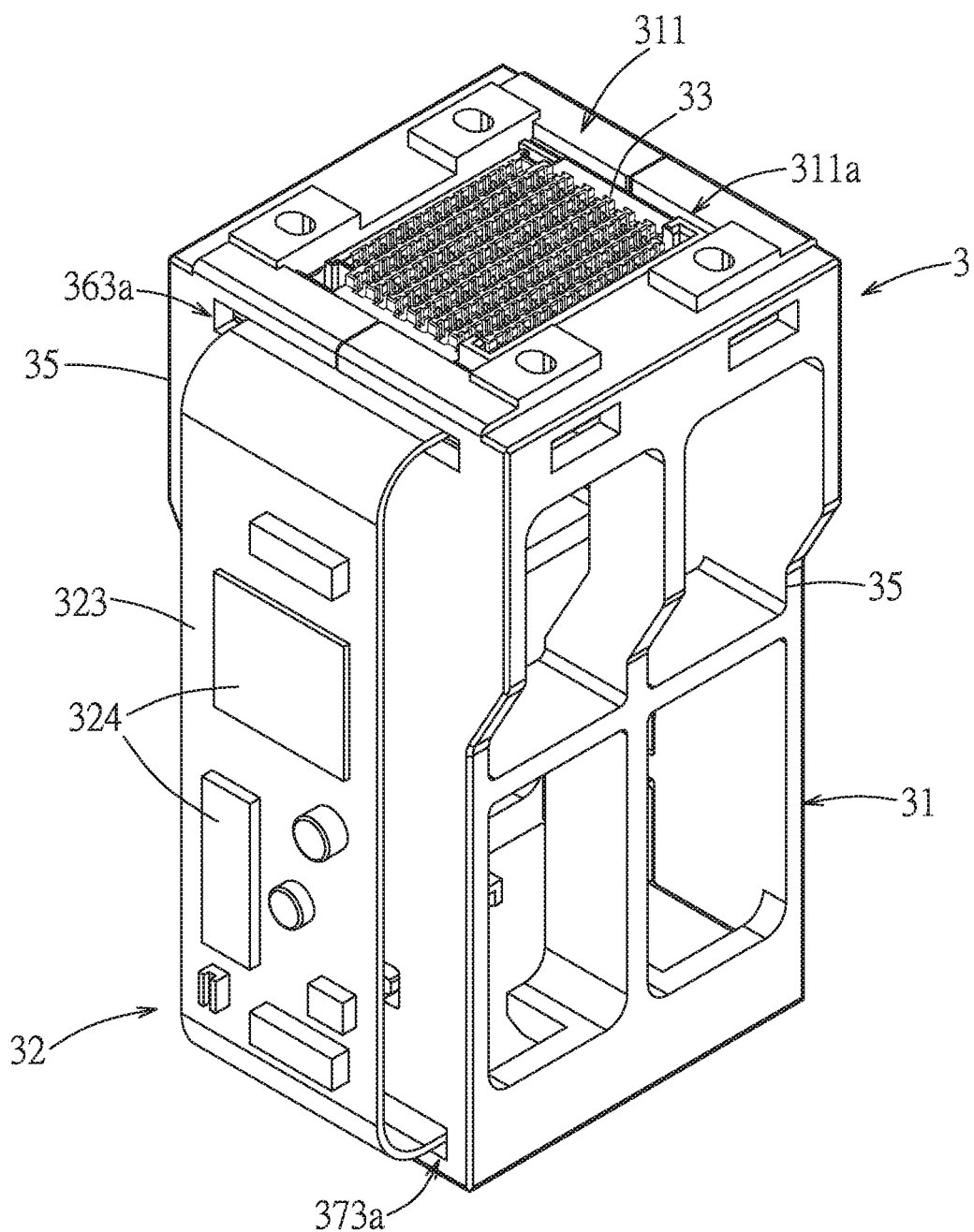
FIG. 6 is a perspective view of a first embodiment of an electrical connection device of the present disclosure.
Figure 7:
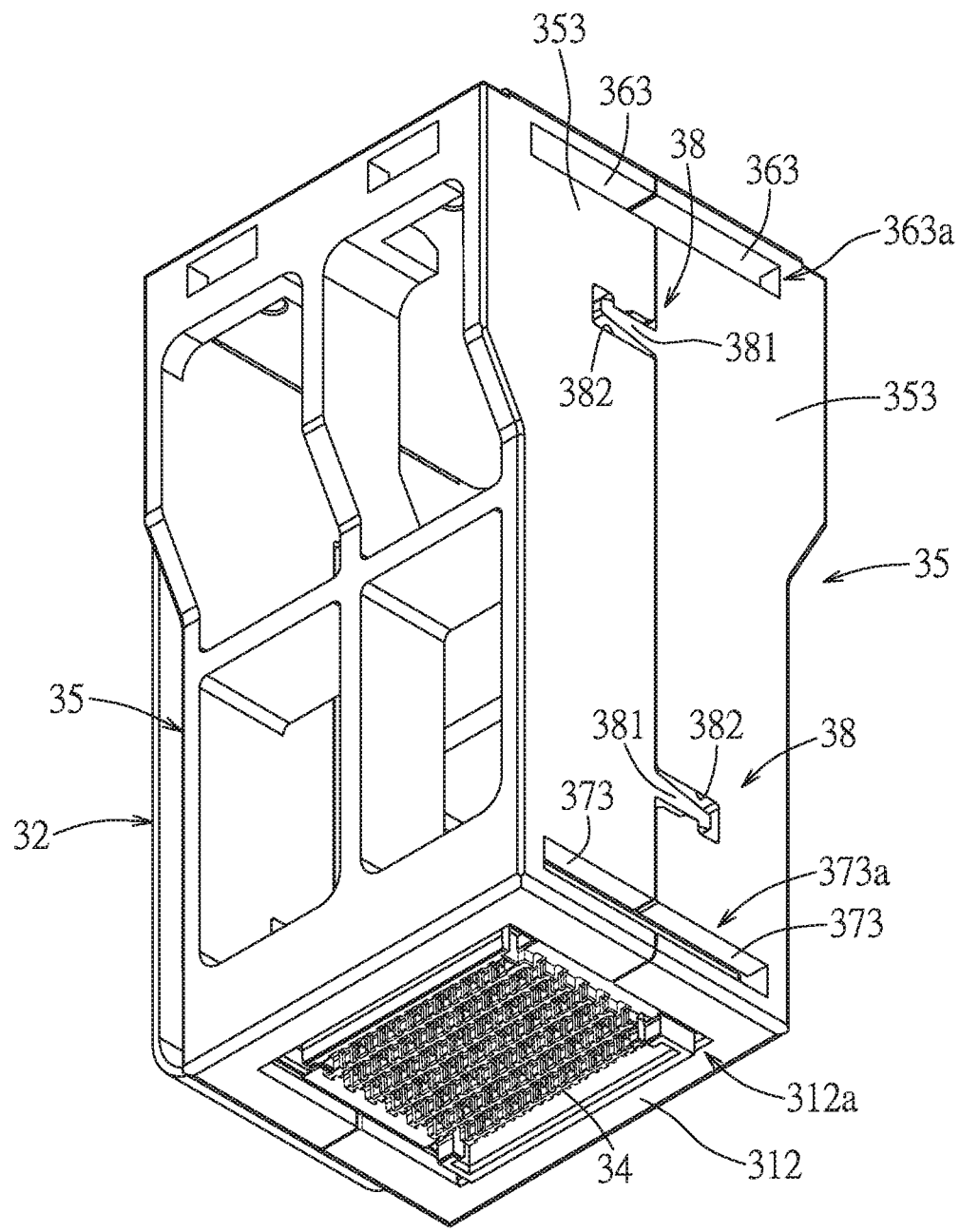
FIG. 7 is a perspective view of the first embodiment of the electrical connection device from another angle.

Referring to FIG. 3 to FIG. 5, the electrical connection device 3 comprises a support frame 31, an adapter circuit board 32, a first connector 33 and a second connector 34. In the embodiment, the first mating connector 11 and the first connector 33 may adopt the same structure and are complementarily connected facing each other, the second mating connector 21 and the second connector 34 may adopt the same structure and are complementarily connected facing each other. In the embodiment, the first connector 33 and the first mating connector 11 are Mezzanine electrical connectors (Mezzanine connector), the second connector 34 and the second mating connector 21 are Mezzanine electrical connectors (Mezzanine connector).

Referring to FIG. 6 to FIG. 10, the support frame 31 has a top portion 311 and a bottom portion 312. In the embodiment, the support frame 31 comprises two engaged frame bodies 35, and the two frame bodies 35 are engaged with each other to define an upper retaining mechanism 36 positioned on the top portion 311 of the support frame 31 and a lower retaining mechanism 37 positioned on the bottom portion 312 of the support frame 31, the function of which will be described later. The two frame bodies 35 of the embodiment have the same structure, each frame body 35 comprises an outer frame portion 350 extending in a vertical direction and having a plurality of hollow openings, two side walls 353, a top frame portion 351 positioned on the top, and a bottom frame portion 352 positioned on the bottom, the top frame portion 351 and the bottom frame portion 352 are respectively formed with recessed notches 351a, 352a, and the notch 351a of the top frame portion 351 and the notch 352a of the bottom frame portion 352 are recessed in the same direction. The two side walls 353 are spaced apart from each other and connected between the top frame portion 351 and the bottom frame portion 352, and each side wall 353 is formed with an upper half penetrating groove 363 close to the top frame portion 351 and a lower half penetrating groove 373 close to the bottom frame portion 352, the function of which will be described later.

Figure 8:
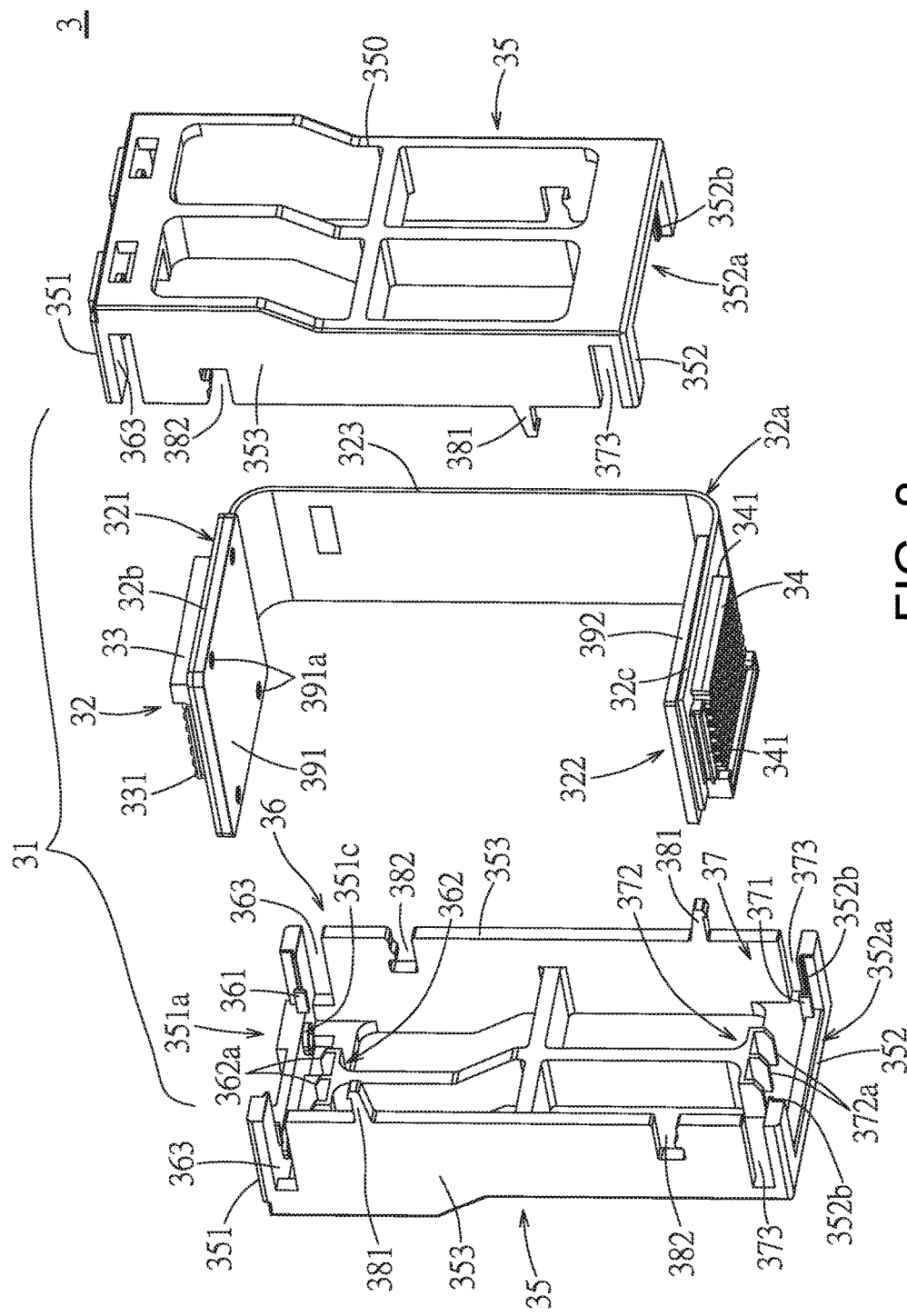
FIG. 8 is an exploded view of the first embodiment of the electrical connection device.
Figure 9:
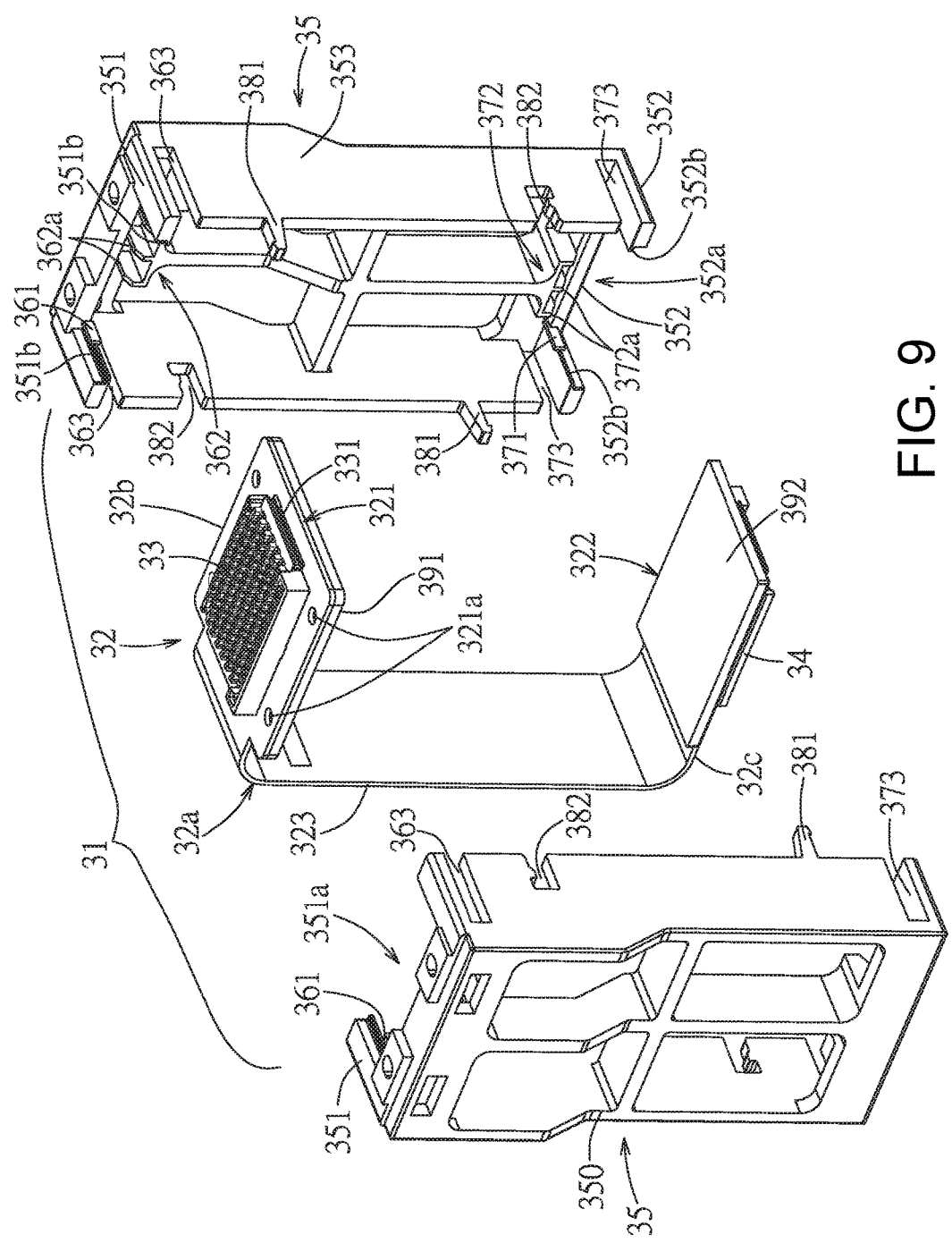
FIG. 9 is an exploded view of the first embodiment of the electrical connection device from another angle.

The support frame 31 further comprises latch structures 38 which are respectively provided to the frame bodies 35 and can be latched with each other, with the configuration of the latch structures 38, the frame bodies 35 can be engaged with each other, the latch structures 38 comprise latching members and complementary latching members which are respectively provided to the two frame bodies 35 and can be latched with each other in a complementary manner. In the embodiment, the latching members and the complementary latching members respectively are latches 381 and latching grooves 382. Specifically, the latching members and the complementary latching members are respectively provided to the two side walls 353 of the frame body 35, and adopting a way that the latch 381 and the latching groove 382 are arranged alternately, the latching members provided on the two frame bodies 35 are the same as the complementary latching members provided on the two frame bodies 35 in number. Referring to FIG. 8, taking one of the frame bodies 35 as an example, the latch 381 and the latching groove 382 are on one of the side walls 353 from top to bottom, the latching groove 382 and the latch 381 are on another side wall 353 from top to bottom, when the two frame bodies 35 face each other, the latching members of one of the frame bodies 35 correspond to the complementary latching members of another frame body 35. Certainly, the latch structures 38 are not limited to the aforementioned structure and configuration, as long as the two frame bodies 35 can be provided to be engaged with each other.

When the two frame bodies 35 are engaged with each other, the top frame portion 351, the bottom frame portion 352 and the two side wall 353 of one of the two frame bodies 35 are respectively engaged with the top frame portion 351, the bottom frame portion 352 and the two side wall 353 of the other of the two frame bodies 35, so the top frame portions 351 of the two frame bodies 35 define the top portion 311 of the support frame 31, and the notches 351a of the two top frame portions 351 define an upper opening 311a, the bottom frame portions 352 of the two frame bodies 35 define the bottom portion 312 of the support frame 31, and the notches 352a of the bottom frame portion 352 define a lower opening 312a, the functions of the upper opening 311a and the lower opening 312a will be described later.

The adapter circuit board 32 has an upper end portion 321, a lower end portion 322 and a side portion 323 positioned between the upper end portion 321 and the lower end portion 322, the upper end portion 321 comprises the first connector 33, the lower end portion 322 comprises the second connector 34, the side portion 323 is provided with a plurality of electronic elements 324. The upper end portion 321 of the adapter circuit board 32 is fixed to the top portion 311 of the support frame 31, the lower end portion 322 is fixed to the bottom portion 312 of the support frame 31, so that the first connector 33 and the second connector 34 are respectively positioned on the top portion 311 and the bottom portion 312 of the support frame 31 and can be respectively mated with the first mating connector 11 (see FIG. 5) of the first circuit board 1 and the second mating connector 21 (see FIG. 4) of the second circuit board 2.

Specifically, the adapter circuit board 32 of the embodiment comprises a circuit board body 32a and the aforementioned first connector 33 and the second connector 34. The circuit board body 32a specifically is a flexible circuit board, the circuit board body 32a is a generally elongate stripe shape and has two end sections 32b, 32c, the first connector 33 and the second connector 34 are respectively provided to the two end sections 32b, 32c and respectively cooperate with the two end sections 32b, 32c to respectively form the aforementioned upper end portion 321 and lower end portion 322, and the first connector 33 and the second connector 34 are provided on the same side surface of the circuit board body 32a. The aforementioned side portion 323 is a part which the circuit board body 32a is positioned between the two end sections 32b, 32c.

In addition, the upper end portion 321 of the adapter circuit board 32 of the embodiment further comprises an upper reinforcement plate 391, the lower end portion 322 further comprises a lower reinforcement plate 392, the upper reinforcement plate 391 and the first connector 33 are respectively positioned on two opposite side surfaces of the end section 32b, the lower reinforcement plate 392 and the second connector 34 are respectively positioned on two opposite side surfaces of the end section 32c, in other words, the upper reinforcement plate 39 is provided to a back portion of the first connector 33 to support the first connector 33, the lower reinforcement plate 392 is provided to a back portion of the second connector 34 to support the second connector 34.

When the two frame bodies 35 of the support frame 31 are engaged with each other, the upper end portion 321 and the lower end portion 322 of the adapter circuit board 32 are respectively retained to the top portion 311 and the bottom portion 312 of the support frame 31 by the upper retaining mechanism 36 and the lower retaining mechanism 37.

Specifically, in the embodiment, the upper retaining mechanism 36 is same as the lower retaining mechanism 37 of each frame body 35, the upper retaining mechanism 36 and lower retaining mechanism 37 each comprise a pair of retaining convex rails 351b, 352b and a pair of stopping blocks 361, 371, the pair of retaining convex rails 351b of the upper retaining mechanism 36 are provided to two opposite inner side edges of the notch 351a of the top frame portion 351, the pair of stopping blocks 361 of the upper retaining mechanism 36 are respectively provided to ends of the retaining convex rails 351b close to the outer frame portion 350. The pair of retaining convex rails 352b of the lower retaining mechanism 36 are provided to the two opposite inner side edges of the notch 352a of the bottom frame portion 352, the pair of stopping blocks 371 of the lower retaining mechanism 37 are respectively provided to ends of the retaining convex rails 352b are close to the outer frame portion 350. In addition, the upper retaining mechanism 36 further comprises an upper support block 362, the lower retaining mechanism 37 further comprises a lower support block 372, the upper support block 362 is formed to the outer frame portion 350 and extends upwardly toward the notch 351a of the top frame portion 351, and the upper support block 362 has a plurality of ribs 362a extending upwardly, the lower support block 372 is formed to the outer frame portion 350 and extends downwardly toward the notch 352a of the bottom frame portion 352, and the lower support block 372 has a plurality of ribs 372a extending downwardly.

Two opposite sides of the first connector 33 each are provided with a retaining concave rail 331, when the adapter circuit board 32 is assembled with the two engaged frame bodies 35, the retaining concave rails 331 positioned at the two sides of the first connector 33 of the upper end portion 321 of the adapter circuit board 32 are respectively sheathed on the two retaining convex rails 351b of the top frame portions 351 of the two frame bodies 35 until the retaining concave rails 331 respectively abut against the stopping blocks 361, at this time, the first connector 33 is exposed to the top portion 311 (see FIG. 6) of the support frame 31 via the upper opening 311a, and the upper support block 362 is positioned below the upper reinforcement plate 391 and supports the back portion of the first connector 33. Similarly, two opposite sides of the second connector 34 are respectively provided with a retaining concave rail 341, the retaining concave rails 341 positioned at the two sides of the second connector 34 of the lower end portion 322 of the adapter circuit board 32 are respectively sheathed on the two retaining convex rails 352b of the bottom frame portions 352 of the two frame bodies 35 until the retaining concave rails 341 respectively abut against the stopping blocks 371, at this time, the second connector 34 is exposed to the bottom portion 312 (see FIG. 7) of the support frame 31 via the lower opening 312a, and the lower support block 372 is positioned above the lower reinforcement plate 392 and supports the back portion of the second connector 34. And the upper half penetrating grooves 363 of the side walls 353 of the two frame bodies 35 are communicated with each other to form a penetrating groove 363a, the lower half penetrating grooves 373 of the side walls 353 of the two frame bodies 35 are communicated with each other to form a penetrating groove 373a, two ends of the adapter circuit board 322 respectively pass through the two penetrating grooves 363a, 373a.

When the adapter circuit board 32 is assembled to the support frame body 31, both the upper end portion 321 and the lower end portion 322 of the adapter circuit board 32 are bent relative to the side portion 323 and face each other in the up-down direction, the whole adapter circuit board 32 is generally C-shaped, the side portion 323 of the adapter circuit board 32 is positioned at one side of the support frame 31, and the first connector 33 and the second connector 34 are arranged back to back. The way that the upper end portion 321 and the lower end portion 322 of the adapter circuit board 32 are respectively fixed to the top portion 311 and the bottom portion 312 of the support frame body 31 is not limited to the configuration of the upper and lower retaining mechanisms 36, 37, as long as the upper end portion 321 and the lower end portion 322 of the adapter circuit board 32 can be respectively fixed to the top portion 311 and the bottom portion 312 of the support frame body 31.

In the embodiment, the two side walls 353 of each frame body 35 are formed with the upper half penetrating grooves 363 and the lower half penetrating grooves 373 which are communicated to form the penetrating grooves 363a, 373a when the frame bodies 35 are engaged with each other, therefore the adapter circuit board 32 can be assembled to the support frame 31 in a direction that the side portion 323 is positioned at either side of two opposite sides of the support frame 31.

Figure 2:
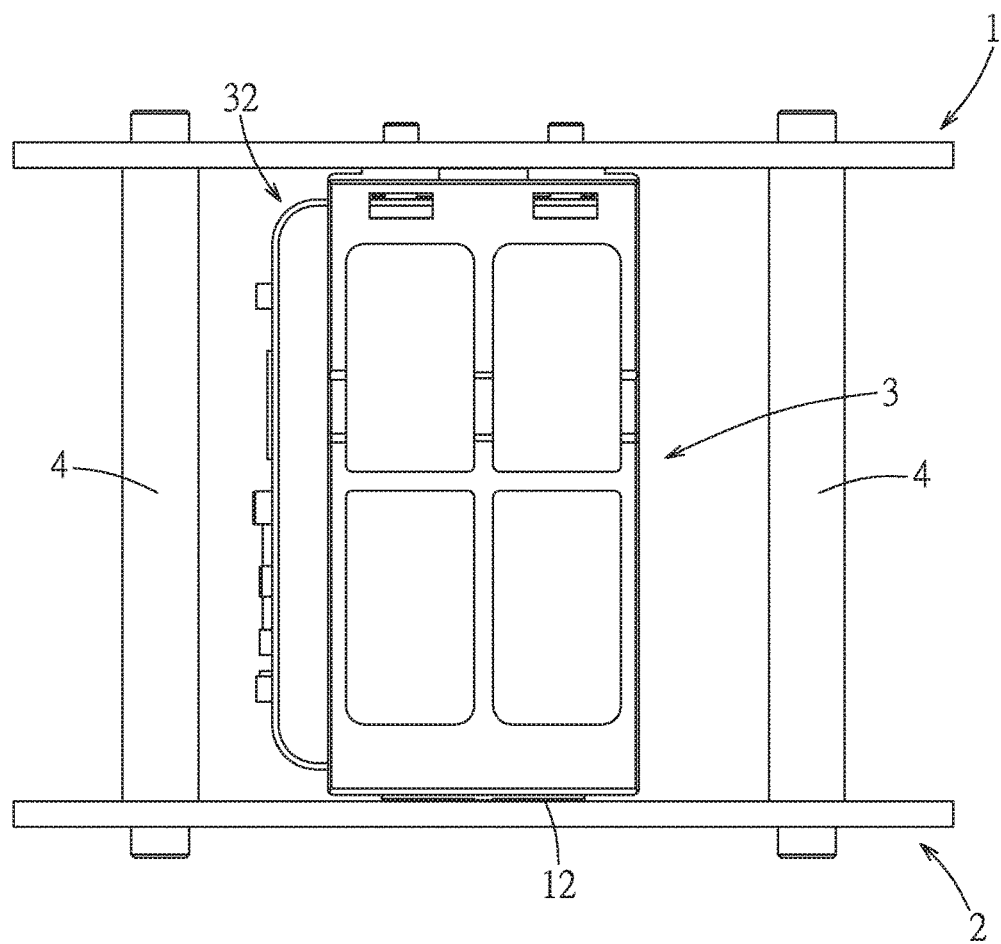
FIG. 2 is a side view of the first embodiment of the board-to-board electrical connection assembly.

Referring to FIG. 3, FIG. 4, FIG. 8 and FIG. 9, when the electrical connection device 3 is assembled and engaged between the first circuit board 1 and the second circuit board 2, the first connector 33 of the electrical connection device 3 can be firstly mated with the first mating connector 11 of the first circuit board 1, and then the top portion 311 of the electrical connection device 3 is locked to the first circuit board 1 by a locking element 5, here, the top frame portion 351 of the frame body 35, the upper end portion 321 of the adapter circuit board 32 and the upper reinforcement plate 391 are locked together by the locking element 5. In the embodiment, the frame body 35 of the support frame 31, the upper end portion 321 of the adapter circuit board 32 and the upper reinforcement plate 391 each are provided with locking holes 35a (see FIG. 3), 321a (see FIG. 9), 391a (see FIG. 8) for the locking element 5 to correspondingly pass through. Next, then the second connector 34 of the electrical connection device 3 is mated with the second mating connector 21 of the second circuit board 2, and when the second connector 34 of the electrical connection device 3 is mated with the second mating connector 21 of the second circuit board 2, as shown in FIG. 2, a gap is preset between the bottom portion 312 of the electrical connection device 3 and the second circuit board 2, so as to prevent mating between the second mating connector 21 and the electrical connection device 3 from being interfered with the support frame 31.

Figure 10:
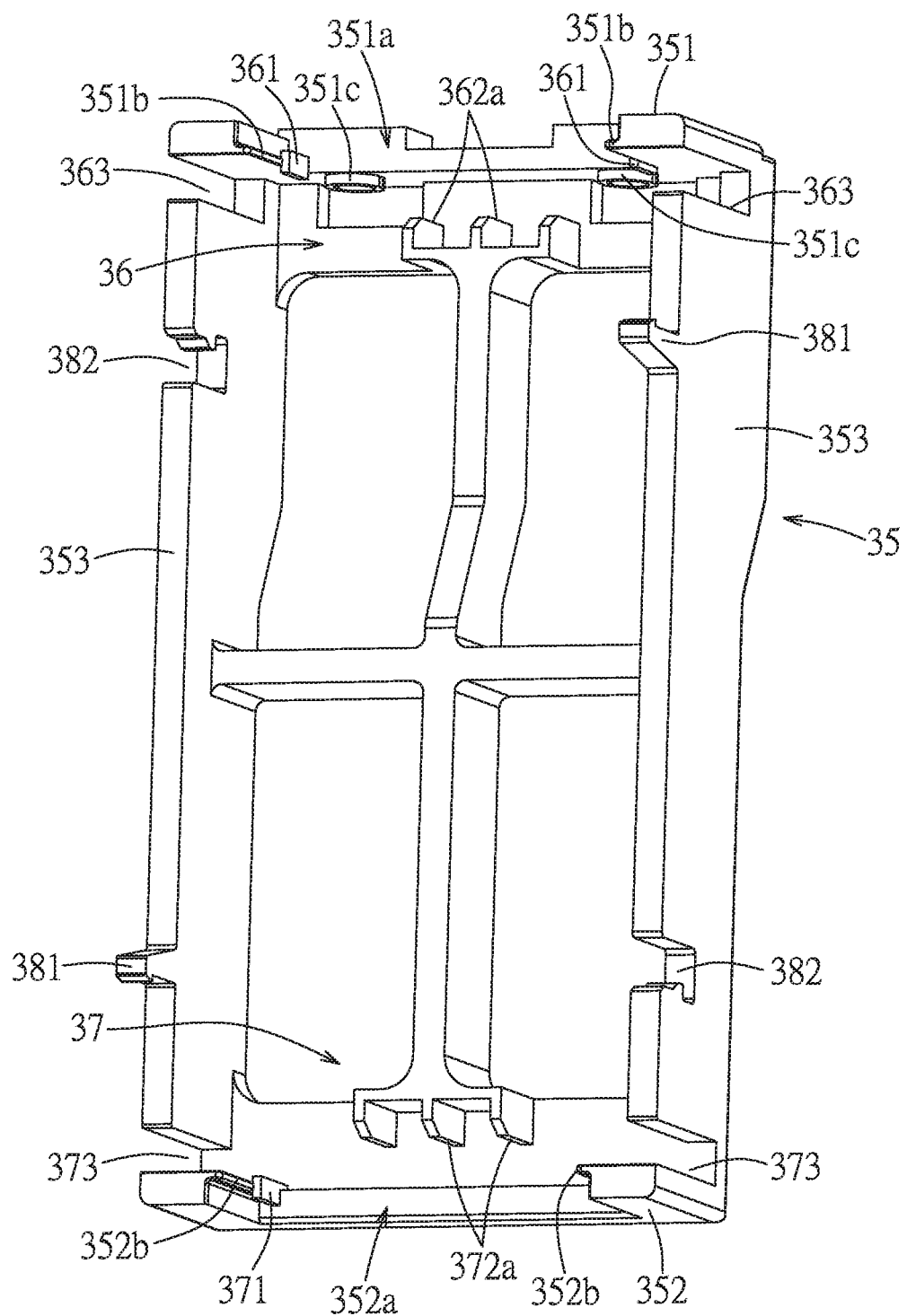
FIG. 10 is a perspective view of a frame body of the first embodiment of the electrical connection device.

Referring to FIG. 10, further, in order to allow that the upper end portion 321 of the adapter circuit board 32 can be stably retained to the upper end portion 321 of the support frame body 31, the upper retaining mechanism 36 further comprises at least a position-limiting block 351c formed to a bottom surface of the top frame portion 351 of each of the two frame bodies 35, In the embodiment, the position-limiting blocks 351c extends downwardly in a ring shape along the locking hole 35a, when the upper end portion 321 of the adapter circuit board 32 is retained to the top frame portion 351 of the support frame body 31, the upper end portion 321 of the adapter circuit board 32 is interposed between the position-limiting blocks 351c and the upper support block 362 of the upper retaining mechanism 36. The movement the upper end portion 321 of the adapter circuit board 32 in the up-down direction of is limited by cooperation of the position-limiting block 351c and the upper support block 362.

Figure 11:
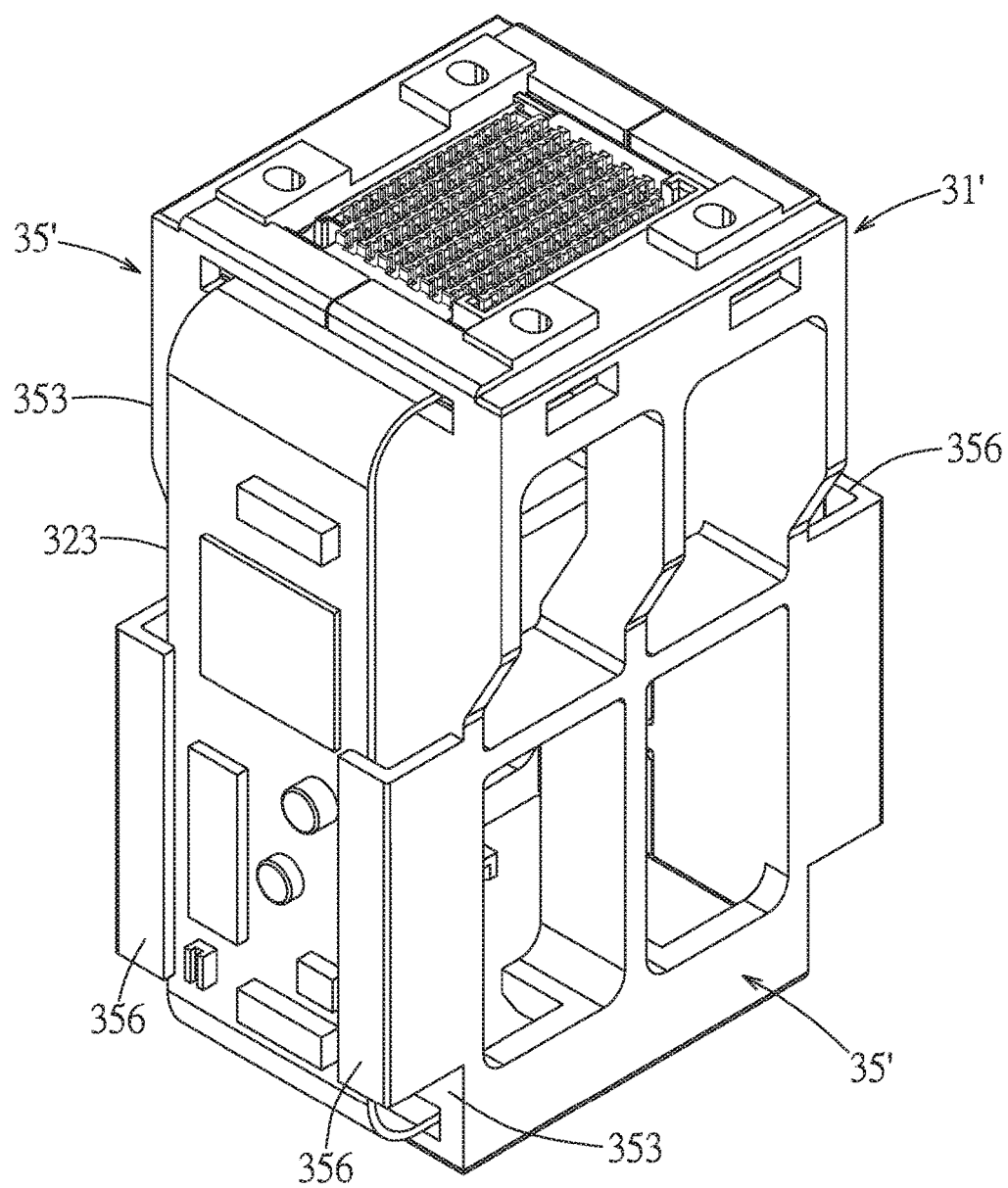
FIG. 11 is a perspective view of a second embodiment of the electrical connection device of the present disclosure.

Referring to FIG. 11, a second embodiment of the electrical connector device 3 of the present disclosure is illustrated and differs from the first embodiment in that each frame body 35' of the support frame 31' further comprises position-limiting pieces 356 respectively extending outwardly from the two side walls 353 and having a L-shaped cross section, when the two frame bodies 35 are engaged with each other, distal ends of the two position-limiting pieces 356 face each other and the side portion 323 of the adapter circuit board 32 can be limited between the two position-limiting pieces 356, which functions as limiting the movement of the side portion 323 of the adapter circuit board 32 and protecting the side portion 323 of the adapter circuit board 32.

Figure 12:
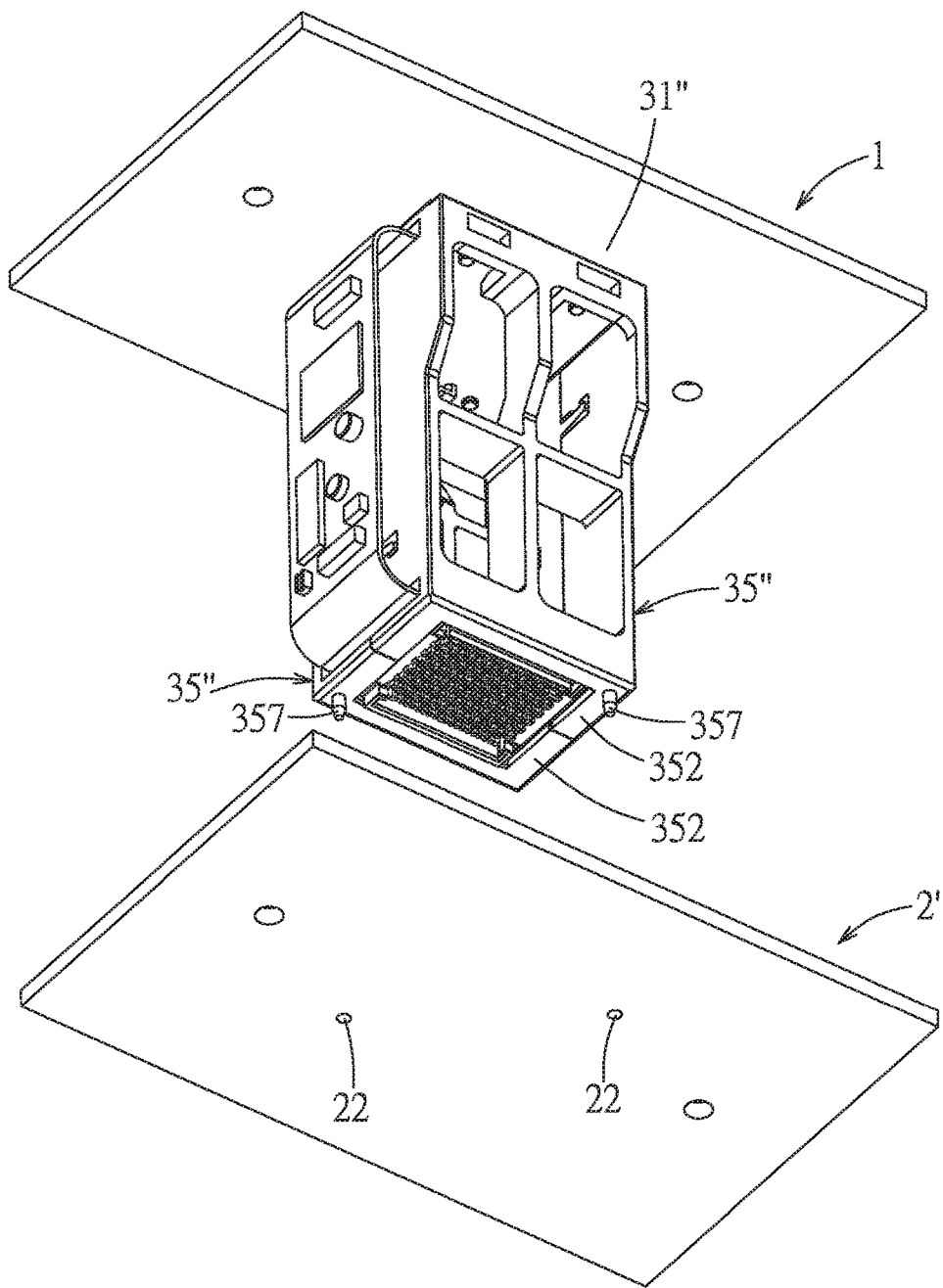
FIG. 12 is a partially exploded view of a third embodiment of the board-to-board electrical connection assembly of the present disclosure.

Referring to FIG. 12, a third embodiment of the board-to-board electrical connector assembly of the present disclosure is illustrated and differs from the first embodiment in that the bottom portion 312 of the support frame 31" is provided with a plurality of positioning posts 357. Specifically, each frame body 35" of the embodiment further comprises positioning posts 357 protruding downwardly from the bottom frame portion 352, and the second circuit board 2' is further provided with a plurality of positioning holes 22, when the electrical connection device is assembled to the second circuit board 2' and the second connector 34 is mated with the second mating connector 21, the insertion of the positioning posts 357 into the positioning holes 22 functions as assisting positioning.

As described above, by that the upper end portion 321 and the lower end portion 322 of the adapter circuit board 32 are respectively fixed to the top portion 311 and the bottom portion 312 of the support frame 31 and then the first, second mating connectors 11, 12 of the circuit board 1, 2 are mated with the first, second connectors 33, 34, compared with the prior art with clamp members to clamp, the electrical connection device and the board-to-board electrical connection assembly of the present disclosure can maintain a better electrical contact, and the support frame 31 provides a better support structure for the adapter circuit board 32, therefore, both the structure and the electrical connection are more stable and reliable.

In addition, the support frame 31 adopts a way that the two frame bodies 35 are engaged, and the structure of the two frame bodies 35 can be the same, in addition to convenience of assembling, ease of manufacturing and cost saving, the height adjustment of the support frame 31 can also be achieved by adjusting a height of the frame body 35 to be manufactured. Furthermore, since the side portion 323 of the adapter circuit board 32 can also be used to provide the electronic elements 324, in addition to facilitating signal processing for adapting during high-speed transmission, also reducing the number of the electronic elements arranged on the circuit boards 1, 2. And the hollow frame-like structure of the support frame 31 itself is beneficial for heat dissipation via air flow.

The above described are only the embodiments of the present disclosure, which cannot limit the scope of the implementation of the present disclosure, that is, simple equivalent variations and modifications made according to the scope of the Claims and the specification content of the present disclosure are intended to fall within the scope of the present disclosure.

What is claimed is:

1. An electrical connection device, comprising:
   a support frame having an interior portion, a first side, a second side, a top portion and a bottom portion, the first and second sides of the support frame being opposite each other, the interior portion being between the top portion and the bottom portion and between the first side and the second side, and the interior portion having at least one through-hole configuring the interior portion to be more open to airflow through the support frame than blocking of airflow through the support frame; and
   an adapter circuit board comprising an upper end portion retained to the top portion of the support frame, a lower end portion retained to the bottom portion of the support frame and a side portion positioned between the upper end portion and the lower end portion and positioned exterior to one of the first side or the second side of the support frame, the upper end portion comprising a first connector, the lower end portion comprising a second connector.

2. The electrical connection device of claim 1, wherein the support frame comprises two engaged frame bodies, and the frame bodies are engaged with each other to define an upper retaining mechanism and a lower retaining mechanism, the upper retaining mechanism is provided to retain the upper end portion of the adapter circuit board; the lower retaining mechanism is provided to retain the lower end portion of the adapter circuit board.

3. The electrical connection device of claim 1, wherein the support frame comprises two engaged frame bodies, the two frame bodies have the same structure, each frame body comprises an outer frame portion and two side walls, a top frame portion and a bottom frame portion which connect the outer frame portion,
   when the frame bodies are engaged with each other, the top frame portions of the frame bodies are engaged with each other to define the top portion of the support frame, the bottom frame portions of the frame bodies are engaged with each other to define the bottom portion of the support frame, and the frame bodies are engaged with each other to define an upper retaining mechanism positioned on the top portion of the support frame and a lower retaining mechanism positioned on the bottom portion of the support frame, the upper retaining mechanism is provided to retain the upper end portion of the adapter circuit board, the lower retaining mechanism is provided to retain the lower end portion of the adapter circuit board.

4. The electrical connection device of claim 3, wherein
one of the upper retaining mechanism and the first connector comprises retaining convex rails, and the other of the upper retaining mechanism and the first connector comprises retaining concave rails in which the retaining convex rails are inserted, the first connector is retained to the upper retaining mechanism by that the retaining convex rails are inserted in the retaining concave rails;
one of the lower retaining mechanism and the second connector comprises retaining convex rails, the other of the lower retaining mechanism and the second connector comprises retaining concave rails in which the retaining convex rails are inserted, the second connector is retained to the lower retaining mechanism embedded by that the retaining convex rails are inserted in the retaining concave rails.

5. The electrical connection device of claim 4, wherein
the top frame portion and the bottom frame portion are respectively formed with recessed notches, when the frame bodies are engaged with each other, the notches of the top frame portions define an upper opening for exposing the first connector, the notches of the bottom frame portions define a lower opening for exposing the second connector, the retaining convex rails of the upper retaining mechanism are provided in pairs to two opposite inner side edges of the notches of the top frame portions, the retaining convex rails of the lower retaining mechanism are provided in pairs to two opposite inner side edges of the notches of the bottom frame portions, the retaining concave rails are respectively provided in pairs to two opposite sides of each of the first connector and the second connector.

6. The electrical connection device of claim 5, wherein
the upper retaining configuration further comprises stopping blocks provided to the retaining convex rails, the first connector abuts against the stopping blocks;
the lower retaining mechanism further comprises stopping blocks provided to the retaining convex rails, the second connector abuts against the stopping blocks.

7. The electrical connection device of claim 6, wherein
the upper retaining mechanism further comprises upper support blocks respectively provided to the frame bodies for supporting a back portion of the first connector,
the lower retaining mechanism further comprises lower support blocks respectively provided to the frame bodies for supporting a back portion of the second connector.

8. The electrical connection device of claim 7, wherein the upper retaining mechanism further comprises at least one position-limiting block formed to each of the frame bodies, when the upper end portion of the adapter circuit board is retained to the top portion of the support frame, the upper end portion of the adapter circuit board is interposed between the position-limiting blocks and the upper support blocks.

9. The electrical connection device of claim 3, wherein
the upper end portion of the adapter circuit board further comprises an upper reinforcement plate for supporting the first connector, the lower end portion of the adapter circuit board further comprises a lower reinforcement plate for supporting the second connector,
the upper reinforcement plate and the first connector are respectively provided to two opposite surfaces of the upper end portion of the adapter circuit board, the lower reinforcement plate and the second connector are respectively provided to two opposite surfaces of the lower end portion of the adapter circuit board.

10. The electrical connection device of claim 3, wherein the support frame further comprises latch structures which are respectively provided to the frame bodies and can make the frame bodies be latched to each other, the latch structures comprise latching members respectively provided to one of the frame bodies and complementary latching members which are provided to the other of the frame bodies and can be latched with the latching members.

11. The electrical connection device of claim 3, wherein each frame body has a plurality of hollow openings.

12. The electrical connection device of claim 3, wherein the adapter circuit board is a flexible circuit board, each side wall is formed with an upper half penetrating groove close to the top frame portion and a lower half penetrating groove close to the bottom frame portion, when the frame bodies are engaged with each other, the upper half penetrating grooves of the frame bodies are communicated with each other to form a penetrating groove, the lower half penetrating grooves of the frame bodies are communicated with each other to form a penetrating groove, two ends of the adapter circuit board respectively pass through the two penetrating grooves.

13. The electrical connection device of claim 3, wherein each frame body further comprises position-limiting pieces respectively extending outwardly from the two side walls and having a L-shaped cross section, when the frame bodies are engaged with each other, distal ends of the position-limiting pieces are face each other and the side portion of the adapter circuit board is limited between the position-limiting pieces.

14. A board-to-board electrical connection assembly, comprising:
an electrical connection device, comprising:
a support frame having an interior portion, a first side, a second side, a top portion and a bottom portion, the first and second sides of the support frame being opposite each other, the interior portion being between the top portion and the bottom portion and between the first side and the second side, and the interior portion having at least one through-hole configuring the interior portion to be more open to airflow through the support frame than blocking of airflow through the support frame; and
an adapter circuit board comprising an upper end portion retained to the top portion of the support frame, a lower end portion retained to the bottom portion of the support frame and a side portion positioned between the upper end portion and the lower end portion and positioned exterior to one of the first side or the second side of the support frame, the upper end portion comprising a first connector, the lower end portion comprising a second connector;
a first circuit board provided with a first mating connector for mating with the first connector; and
a second circuit board provided with a second mating connector for mating with the second connector.

15. The board-to-board electrical connection assembly of claim 14, wherein the support frame comprises two engaged frame bodies, and the frame bodies are engaged with each other to define an upper retaining mechanism and a lower retaining mechanism, the upper retaining mechanism is provided to retain the upper end portion of the adapter circuit board; the lower retaining mechanism is provided to retain the lower end portion of the adapter circuit board.

16. The board-to-board electrical connection assembly of claim 14, wherein
the support frame comprises two engaged frame bodies, the two frame bodies have the same structure, each frame body comprises an outer frame portion and two side walls, a top frame portion and a bottom frame portion which connect the outer frame portion,
when the frame bodies are engaged with each other, the top frame portions of the frame bodies are engaged with each other to define the top portion of the support frame, the bottom frame portions of the frame bodies are engaged with each other to define the bottom portion of the support frame, and the frame bodies are engaged with each other to define an upper retaining mechanism positioned on the top portion of the support frame and a lower retaining mechanism positioned on the bottom portion of the support frame, the upper retaining mechanism is provided to retain the upper end portion of the adapter circuit board, the lower retaining mechanism is provided to retain the lower end portion of the adapter circuit board.

17. The board-to-board electrical connection assembly of claim 16, wherein
one of the upper retaining mechanism and the first connector comprises retaining convex rails, and the other of the upper retaining mechanism and the first connector comprises retaining concave rails in which the retaining convex rails are inserted, the first connector is retained to the upper retaining mechanism by that the retaining convex rails are inserted in the retaining concave rails;
one of the lower retaining mechanism and the second connector comprises retaining convex rails, the other of the lower retaining mechanism and the second connector comprises retaining concave rails in which the retaining convex rails are inserted, the second connector is retained to the lower retaining mechanism embedded by that the retaining convex rails are inserted in the retaining concave rails.

18. The board-to-board electrical connection assembly of claim 17, wherein
the top frame portion and the bottom frame portion are respectively formed with recessed notches, when the frame bodies are engaged with each other, the notches of the top frame portions define an upper opening for exposing the first connector, the notches of the bottom frame portions define a lower opening for exposing the second connector, the retaining convex rails of the upper retaining mechanism are provided in pairs to two opposite inner side edges of the notches of the top frame portions, the retaining convex rails of the lower retaining mechanism are provided in pairs to two opposite inner side edges of the notches of the bottom frame portions, the retaining concave rails are respectively provided in pairs to two opposite sides of each of the first connector and the second connector.

19. The board-to-board electrical connection assembly of claim 18, wherein
the upper retaining configuration further comprises stopping blocks provided to the retaining convex rails, the first connector abuts against the stopping blocks;
the lower retaining mechanism further comprises stopping blocks provided to the retaining convex rails, the second connector abuts against the stopping blocks.

20. The board-to-board electrical connection assembly of claim 19, wherein
the upper retaining mechanism further comprises upper support blocks respectively provided to the frame bodies for supporting a back portion of the first connector,
the lower retaining mechanism further comprises lower support blocks respectively provided to the frame bodies for supporting a back portion of the second connector.

21. The board-to-board electrical connection assembly of claim 20, wherein the upper retaining mechanism further comprises at least one position-limiting block formed to each of the frame bodies, when the upper end portion of the adapter circuit board is retained to the top portion of the support frame, the upper end portion of the adapter circuit board is interposed between the position-limiting blocks and the upper support blocks.

22. The board-to-board electrical connection assembly of claim 16, wherein
the upper end portion of the adapter circuit board further comprises an upper reinforcement plate for supporting the first connector, the lower end portion of the adapter circuit board further comprises a lower reinforcement plate for supporting the second connector,
the upper reinforcement plate and the first connector are respectively provided to two opposite surfaces of the upper end portion of the adapter circuit board, the lower reinforcement plate and the second connector are respectively provided to two opposite surfaces of the lower end portion of the adapter circuit board.

23. The board-to-board electrical connection assembly of claim 16, wherein the support frame further comprises latch structures which are respectively provided to the frame bodies and can make the frame bodies be latched to each other, the latch structures comprise latching members respectively provided to one of the frame bodies and complementary latching members which are provided to the other of the frame bodies and can be latched with the latching members.

24. The board-to-board electrical connection assembly of claim 16, wherein each frame body has a plurality of hollow openings.

25. The board-to-board electrical connection assembly of claim 16, wherein
the adapter circuit board is a flexible circuit board, each side wall of each frame body is formed with an upper half penetrating groove close to the top frame portion and a lower half penetrating groove close to the bottom frame portion,
when the frame bodies are engaged with each other, the upper half penetrating grooves of the frame bodies are communicated with each other and form a penetrating groove, the lower half penetrating grooves of the frame bodies are communicated with each other and form a penetrating groove, two ends of the adapter circuit board respectively pass through the two penetrating grooves.

26. The board-to-board electrical connection assembly of claim 16, wherein each frame body further comprises position-limiting pieces respectively extending outwardly from the two side walls and having a L-shaped cross section, when the frame bodies are engaged with each other, distal ends of the position-limiting pieces are face each other and the side portion of the adapter circuit board is limited between the position-limiting pieces.

27. The board-to-board electrical connection assembly of claim 16, wherein each frame body further comprises a positioning post protruding downwardly from the bottom frame portion, and the second circuit board is provided with two positioning holes, when the second connector of the electrical connection device is mated with the second mating connector of the second circuit board, the positioning posts of the frame bodies are respectively inserted into the positioning holes.

28. The board-to-board electrical connection assembly of claim 14, further comprising two support post bodies provided between the first circuit board and the second circuit board.

29. The board-to-board electrical connection assembly of claim 14, wherein the first connector is the same as the first mating connector in structure, and the second connector is the same as the second mating connector in structure.

30. The board-to-board electrical connection assembly of claim 29, wherein the first connector and the first mating connector are Mezzanine electrical connectors, the second connector and the second mating connector are Mezzanine electrical connectors.

31. The board-to-board electrical connection assembly of claim 14, further comprising a locking element for locking the top portion of the support frame, the upper end portion of the adapter circuit board and the first circuit board, the top portion of the support frame, the upper end portion of the adapter circuit board and the first circuit board are respectively provided with locking holes for the locking element to pass through and be locked.

* * * * *